(12) United States Patent
Park et al.

(10) Patent No.: US 6,501,684 B1
(45) Date of Patent: Dec. 31, 2002

(54) INTEGRATED CIRCUIT HAVING AN EEPROM AND FLASH EPROM

(75) Inventors: Eungjoon Park, Fremont, CA (US); Ali Pourkeramati, Redwood City, CA (US)

(73) Assignee: Azalea Microelectronics Corporation, Santa Clara, CA (US)

( * ) Notice: Subject to any disclaimer, the term of this patent is extended or adjusted under 35 U.S.C. 154(b) by 9 days.

(21) Appl. No.: 09/668,431

(22) Filed: Sep. 22, 2000

Related U.S. Application Data

(60) Provisional application No. 60/155,935, filed on Sep. 24, 1999.

(51) Int. Cl.$^7$ .............................................. G11C 16/04
(52) U.S. Cl. ............................ 365/185.33; 365/185.28; 365/185.29
(58) Field of Search ....................... 365/185.33, 185.12, 365/185.14, 185.18, 185.26, 185.28, 185.29, 185.11; 257/321, 316; 438/258

(56) References Cited

U.S. PATENT DOCUMENTS

| | | | |
|---|---|---|---|
| 4,758,986 A | 7/1988 | Kuo | 365/185 |
| 5,172,338 A | 12/1992 | Mehrotra et al. | 365/185 |
| 5,612,913 A * | 3/1997 | Cappelletti et al. | 365/185.12 |
| 5,734,609 A * | 3/1998 | Choi et al. | 365/185.17 |
| 5,747,849 A | 5/1998 | Kuroda et al. | 257/321 |
| 5,949,718 A | 9/1999 | Randolph et al. | 365/185.33 |
| 5,966,328 A * | 10/1999 | Kobatake | 365/185.14 |
| 6,118,706 A * | 9/2000 | Smayling et al. | 365/185.33 |

FOREIGN PATENT DOCUMENTS

| | | | | |
|---|---|---|---|---|
| JP | 406097455 A | * | 4/1994 | G11C/16/06 |
| JP | 10-241381 | | 9/1998 | |

* cited by examiner

*Primary Examiner*—Hoai Ho
*Assistant Examiner*—David Lam
(74) *Attorney, Agent, or Firm*—Townsend and Townsend and Crew LLP

(57) ABSTRACT

In accordance with the present invention, a non-volatile integrated circuit memory includes an EEPROM array comprising a plurality of memory cells and a flash EPROM array comprising a second plurality of memory cells, wherein the EEPROM array is capable of being erased byte-by-byte or word-by-word, and the flash EPROM array is capable of being erased sector-by-sector. Both arrays are formed using the same memory cell which is programmed using hot-electron injection and is erased using Fowler-Nordheim tunneling.

26 Claims, 3 Drawing Sheets

EEPROM Table

| Mode | Selected ROW0 | Unselected ROW1 | Selected Gwl0 | Unselected Gwl0 | VSS | VVSS | Selected Byte Sel0 | Selected Byte Sel0 | Unselected Byte Sel1 | Unselected Byte Sel1 | Selected Bl00 | Selected Bl07 | Unselected Bl10 | Unselected Bl17 |
|---|---|---|---|---|---|---|---|---|---|---|---|---|---|---|
| Erase | 10V | 0V | -10V | 0V | 0V | Float | -10V | 0V | 0V | -10V | 0.5V | 0.5V | 0V | 0V |
| Program | 10V | 0V | 10V | 0V | 0V | 0V | 0V | 10V | 10V | 0V | 0.5V | 0.5V | 0V | 0V |
| Read | 3V | 0V | 3V | 3V | 0V | 0V | 0V | 3V | 3V | 0V | 1V | 1V | 0V | 0V |

FIG. 2

INTEGRATED CIRCUIT HAVING AN EEPROM AND FLASH EPROM

CROSS-REFERENCES TO RELATED APPLICATIONS

The present application claims benefit of the filing date of U.S. Provisional Application No. 60/155,935, filed on Sep. 24, 1999, and incorporates herein by reference U.S. Application No. 09/503,982, filed on Apr. 12, 2000, and entitled "Non-Volatile Memory Cell Capable Of Being Programmed And Erased Through Substantially Separate Areas Of One Of Its Drain-Side And Source-Side Regions", and further incorporates U.S. Application No. 09/433,245, filed on Nov. 13, 1999, and entitled "Flash Memory Architecture And Method Of Operation."

BACKGROUND OF THE INVENTION

The present invention relates to semiconductor memories, and in particular, to a semiconductor integrated circuit memory that includes both EEPROM and flash EPROM arrays.

Electrically erasable programmable read only memory (EEPROM) and flash erasable programmable read only memory (EPROM) are two known types of non-volatile memory devices.

An EEPROM device typically includes arrays of EEPROM cells arranged in rows and columns. In an EEPROM device, each group of memory cells forming a data byte (e.g., eight memory cells) is individually accessible and thus can be programmed and erased independent of the other data bytes. A conventional EEPROM cell includes a tunnel oxide through which electrons tunnel (a process commonly referred to as Fowler-Nordheim (FN) tunneling) during both programming and erase operations. Furthermore, in an EEPROM device, each memory cell has a dedicated select transistor.

A flash EPROM device typically includes arrays of flash EPROM cells arranged in rows and columns. In a flash EPROM device, erase operation is typically performed on a sector-by-sector basis, each sector including a block of cells, e.g., one or more rows or columns of cells. Therefore, all memory cells disposed in a sector are erased at once. Alternatively, if a flash EPROM array is not divided into sectors, all the flash EPROM cells disposed within the memory device are erased at once. A conventional flash EPROM cell uses hot electron injection for programming and FN tunneling for erase operations.

Flash EPROM and EEPROM devices are often used in different applications. Generally, because of its smaller size, a flash EPROM device is less expensive than an EEPROM device having the same storage capacity and is thus more widely used, for example, in mass data storage applications where reprogrammability occurs less frequently. However, where byte-by-byte reconfigurability and non-volatility is a requirement, EEPROM devices are typically used.

With the rapid growth of the battery operated portable electronic devices, there has been a parallel increase in demand for non-volatile memory devices such as EEPROMs and flash EPROMs within the same portable device. Cellular phones, for example, commonly include both types of memory devices, with the EEPROM typically storing the user reconfigurable information and the flash EPROM typically storing operating algorithms or other types of data.

The ever increasing market demands for more compact and low power electronic devices has made it desirable to combine these two types of memory arrays on the same integrated circuit housed within the same package. However, combining these two types of memories in the same integrated circuit in an efficient manner and such that each memory type maintains its flexibility (e.g., byte erasable EEPROM) has been difficult because of the divergent requirements of the flash EPROM and EEPROM cell technologies.

SUMMARY

In accordance with the present invention, a non-volatile integrated circuit memory includes an EEPROM array comprising a plurality of memory cells and a flash EPROM array comprising a second plurality of memory cells, wherein the EEPROM array is capable of being erased byte-by-byte or word-by-word, and the flash EPROM array is capable of being erased sector-by-sector.

In one embodiment, both arrays are formed using the same memory cell which is programmed using hot-electron injection and is erased using Fowler-Nordheim tunneling.

In another embodiment, a pair of byte-select transitors couple each memory cell in the EEPROM array to a corresponding bitline. The pair of byte-select transistors respectively couple the memory cell to one of a signal line and a voltage supply line.

In another embodiment, the EEPROM and the flash EPROM arrays share the same high voltage circuitry and control logic.

BRIEF DESCRIPTION OF THE DRAWINGS

FIG. 2 exemplifies, in a table format, voltage conditions that are applied to the EEPROM array of FIG. 1 during each of the programming, erase, and read operations.

DETAILED DESCRIPTION

Figure 1:
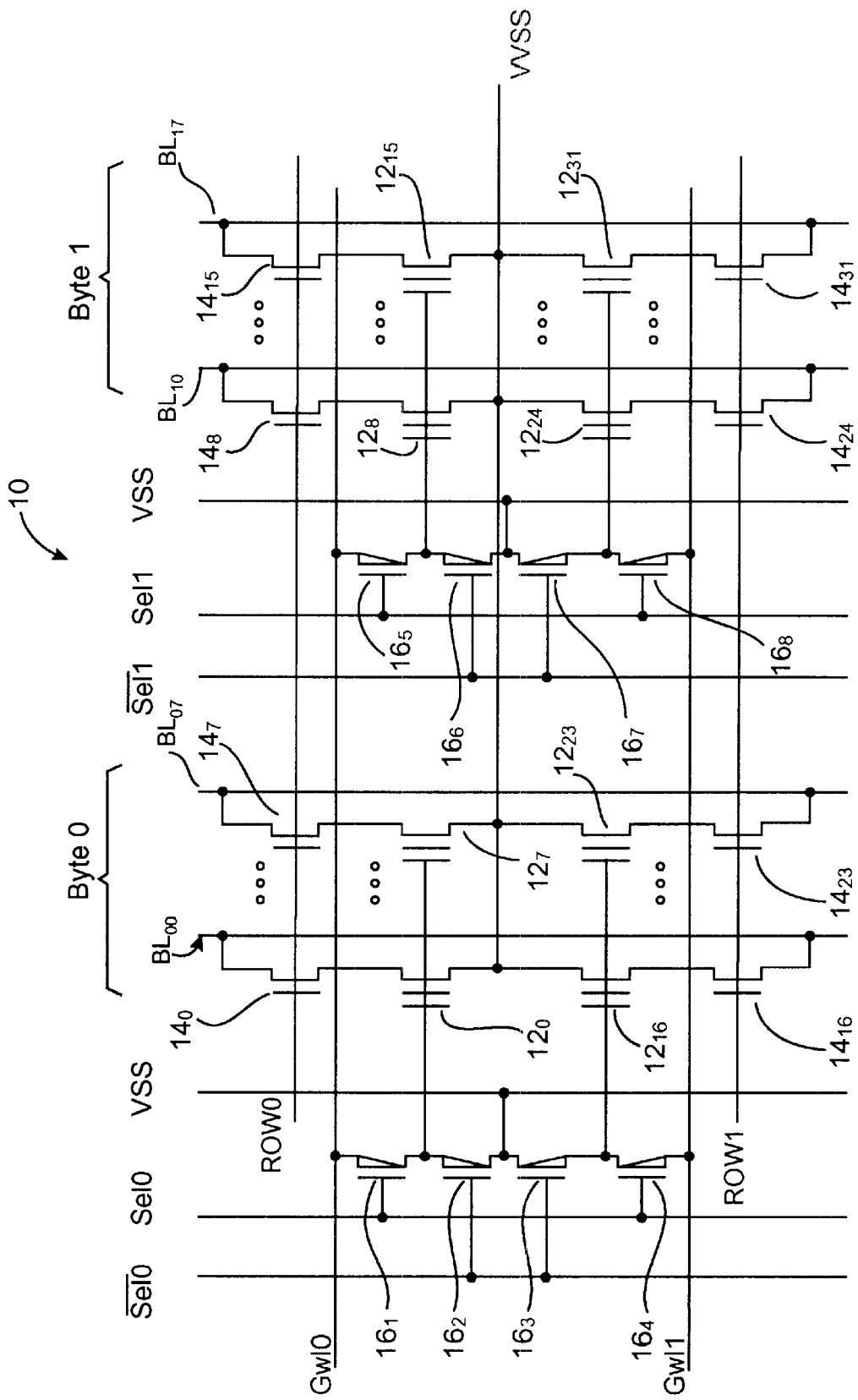
FIG. 1 shows a transistor schematic diagram of a section of an EEPROM array, in accordance with one embodiment of the present disclosure.

FIG. 1 shows a transistor schematic diagram of a section 10 of an EEPROM array, in accordance with one embodiment of the present disclosure. A multiplicity of programmable memory cells $12_i$ are arranged in two rows and sixteen columns in array section 10. The structure and operation of the programmable memory cell $12_i$ is described in detail in the above-referenced U.S. application Ser. No. 09/503,982. The sixteen columns are arranged in two groups of eight columns, one group being designated as byte 0 and the other as byte 1. Only two columns in each byte are shown for simplicity. Arranging the columns of cells in groups of eight (bytes) is illustrative only, and other arrangements such as groups of sixteen (words) are also possible. For example, depending on the I/O bit configuration of the memory device (e.g., by 4, or by 8, or by 16, or by 32), the columns of cells may be arranged in corresponding groups (e.g., 8 columns, or 16 columns, or 32 columns).

In the following, different instances of similar components are identified by similar reference numerals having different indices which appear as subscripts to the identifying reference numerals. For example, the eight shown instances of programmable memory cells are labeled as $12_0$, $12_7$, $12_8$, $12_{15}$, $12_{16}$, $12_{23}$, $12_{24}$ and $12_{31}$. Each bitline in FIG.

1 is identified by letters BL each having a two-digit index appearing as a subscript thereto. The first digit of the index indicate the byte number in which the bitline is disposed, and the second digit of the index indicates the bit position within the byte in which the bitline is disposed. For example, bitline $BL_{00}$ refers to bitline 0 in byte number 0, and bitline $BL_{17}$, refers to bitline 7 in byte number 1. As shown, memory cells $12_0$ and $12_7$ respectively form bits 0 and 7 of byte 0 in the top row, memory cells $12_{16}$ and $12_{23}$ respectively form bits 0 and 7 of byte 0 in the bottom row, memory cells $12_8$ and $12_{15}$ respectively form bits 0 and 7 of byte 1 in the top row, and memory cells $12_{24}$ and $12_{31}$ respectively form bits 0 and 7 of byte 1 in the bottom row.

Each programmable memory cell $12_i$ has a dedicated NMOS select transistor $14_i$ for coupling cell $12_i$ to the cell's associated bit line $BL_{ij}$. For example, cell $12_0$ is coupled to bitline $BL_{00}$ via select transistor $14_0$; cell $12_{15}$ is coupled to bitline $BL_{17}$ via select transistor $14_{15}$. As shown, the gate, drain, and source terminals of each select transistor $14_i$ are respectively coupled to a wordline, a bitline and to the select transistor's associated cell $12_i$. For example, the gate, drain, and source terminals of transistor $14_0$ are respectively coupled to wordline ROW0, bitline $BL_{00}$, and to the drain terminal of cell $12_0$.

The source terminals of all cells $12_i$ disposed in each pair of adjacent rows are coupled together and to the same supply voltage line VVSS. Therefore, all memory cells along the two adjacent rows shown in FIG. 1 have their source terminals connected together and to the same VVSS line.

Associated with each group of cells in a data byte is a pair of PMOS byte-select transistors for coupling the gate terminals of the cells in the data byte to either a signal line Gwli or a voltage supply line VSS. Eight such byte-select transistors $16_1$ to $16_8$ are shown in FIG. 1. Byte-select transistors $16_1$ and $16_2$ respectively couple the gate terminals of the cells in byte 0 of the to row to signal line Gwl0 and supply line VSS. Byte-select transistors $16_3$ and $16_4$ respectively couple the gate terminals of the cells in byte 0 of the bottom row to Gwl1 and VSS lines. Byte-select transistors $16_5$ and $16_6$ respectively couple the gate terminals of the cells in byte 1 of the top row to Gwl0 and VSS lines. Byte-select transistors $16_7$ and $16_8$ respectively couple the gate terminals of the cells in byte 1 of the bottom row to Gwl1 and VSS lines.

The gate terminals of all byte-select transistors which couple their respective cells in a given data byte to Gwl0 and Gwl1 lines receive the same select signal Seli. For example, byte-select transistors $16_1$ and $16_4$ which couple the gate terminals of their respective cells in byte 0 to Gwl0 and Gwl1 lines receive the same select signal Sel0 at their gate terminals. Similarly, byte-select transistors $16_5$ and $16_8$ which couple the gate terminals of their respective cells in byte 1 to Gwl0 and Gwl1 lines receive the same select signal Sel1 at their gate terminals.

The gate terminals of all byte-select transistors which couple their respective cells in a given data byte to VSS line receive the same complement select signal $\overline{Seli}$. For example, byte-select transistors $16_2$ and $16_3$ which couple the gate terminals of their respective cells in byte 0 to VSS line receive the same complement select signal $\overline{Sel0}$ at their gate terminals. Similarly, byte-select transistors $16_6$ and $16_7$ which couple the gate terminals of their respective cells in byte 1 to VSS line receive the same complement select signal $\overline{Sel1}$ at their gate terminals.

FIG. 2 exemplifies, in a table format, voltage conditions that are applied to the array section 10 of FIG. 1 during each of the programming, erase, and read operations. The indicated voltage levels are illustrative only and may vary depending on, for example, the process technology, the cell technology, the array configuration, and the like. The row corresponding to "Program" shows the requisite biasing to program one or more of the eight cells of the data byte in byte 0 of the top row in FIG. 1. The row corresponding to "Erase" shows the requisite biasing to erase one or more of the eight cells of the data byte in byte 0 of the top row in FIG. 1. The row corresponding to "Read" shows the requisite biasing to read out the eight cells of the data byte in byte 0 of the top row in FIG. 1. Each of the programming, erase, and read operations is described next using the exemplary biasing conditions shown in table of FIG. 2.

Each cell $12_i$ is programmed using hot electron injection and erased using Fowler-Nordheim (FN) tunneling as described in the above-referenced U.S. application Ser. No. 09/503,982. In accordance with the biasing example shown in FIG. 2, to program a cell $12_i$, 10 volts is applied to the cell's gate terminal and 5 volts is applied to the cell's drain terminal, and the cell's source terminal is grounded. Assuming, for example, that the cells in byte 0 of the top row are initially in an erased state, and that it is desired to program bit 0 (i.e., cell $12_0$) of this data byte. The voltages applied to the selected wordline ROW0 and bitline $BL_{00}$ are 10 volts and 5 volts respectively. All the unselected wordlines, e.g., ROW1, receive 0 volts. Similarly, the selected line Gwl0 is set to 10 volts while the unselected supply voltage line Gwl1 is set to 0 volts. The voltage applied to each of supply lines VSS and VVSS is 0 volts. The voltages applied to select signals Sel0 and Sel1 are respectively 0 and 10 volts, and thus the complement select signals $\overline{Sel0}$ and $\overline{Sel1}$ are at 10 and 0 volts, respectively.

With the above biasing, since the gate and drain terminals of NMOS transistor $14_0$ respectively receive 10 and 5 volts, the drain terminal of cell $12_0$ receives the 5 volts applied to $BL_{00}$. With 0 and 10 volts respectively applied to the gate and source terminals of PMOS byte-select transistor $16_1$, the gate terminal of cell $12_0$ receives 10 volt. Thus, the voltages applied to the gate, drain, and source terminals of cell $12_0$ are respectively 10, 5 and 0 volts, which cause cell $12_0$ to be programmed.

If only bit 0 of byte 0 of the top row (i.e., cell $12_0$) is desired to be programmed, the other bitlines $BL_{01}$ to $BL_{07}$ in byte 0 of the top row are biased to 0 volts, and therefore, cells $12_1$ to $12_7$ maintain their previous states. If other cells in the same data byte are desired to be programmed, their corresponding bitlines need to be biased to 5 volts. The gate terminals of the cells in byte 0 of the bottom row are coupled to Gwl1 line which receives 0 volts. Accordingly, all cells $12_{16}$ to $12_{23}$ forming the 8 bits of byte 0 in bottom row maintain their previous states. Because Sel1 and $\overline{Sel1}$ lines are respectively biased to 10 volts and 0 volts, the gate terminals of all cells forming byte 1 in each of the top and bottom rows are coupled to VSS line through their respective byte-select transistors $16_6$ and $16_7$, and thus all these cells also maintain their previous states. each of the top and bottom rows are coupled to VSS line through their respective byte-select transistors $16_6$ and $16_7$, and thus all these cells also maintain their previous states.

In accordance with the biasing example shown in FIG. 2, to erase a cell $12_i$, its source terminal is caused to float, while –10 volts and 5 volts are respectively applied to the cell's gate and drain terminals. Assuming that the eight cells in byte 0 of the top row are in programmed state, and it is desired to erase only these eight cells, the voltage applied to the selected wordline ROW0 is set to 10 volts while that applied to the unselected wordlines e.g., ROW1, is set to 0 volts. The voltages applied to the selected Gwl0 line and the unselected Gwl1 line are respectively set to −10 and 0 volts. Supply line VSS receives 0 volts while supply line VVSS is caused to float through a device not shown in FIG. 2. Select signals Sel0 and Sel1 are respectively set to −10 and 0 volts thereby causing signals $\overline{Sel0}$ and $\overline{Sel1}$ to be at 0 and −10, respectively. Since it is desired to erase all eight cells in byte 0 of the top row, the voltage of all bitlines $BL_{00}$ to $BL_{07}$ are set to 5 volts while that of all the other bitlines in the array are set to 0 volts. If fewer than the eight bits in the data byte are desired to be erased, the bitlines corresponding to the cells not to be erased are set to 0 volts.

With the above erase biasing conditions, the drain and gate terminals of the eight cells selected for erase receive 5 and −10 volts respectively, while the source terminals of the eight cells float. This causes all eight cells to be erased simultaneously. Except for the selected eight cells in byte 0 of the top row, none of the other cells in the array experience the voltage conditions required for the erase operation and therefore maintain their previous states.

In accordance with the biasing example shown in FIG. 2, to read a cell $12_i$, 3 volts is applied to the cell's gate terminal, and 1 volts is applied to cell's drain terminal, and the cell's source terminal is grounded. Assuming, for example, data byte 0 in the top row is to be read, wordlines ROW0 and ROW1 are respectively set to 3 and 0 volts, both Gwl0 and Gwl1 are set to 3 volts, and supply lines VSS and VVSS are both set to 0 volts. elect signals Sel0 and Sel1 are respectively set to 0 and 3 volts thereby causing signals $\overline{Sel0}$ and $\overline{Sel1}$ to be at 3 and 0 volts, respectively. Accordingly, the gate terminals of all ells $12_0$ to $12_7$ in byte 0 of the top row receive 3 volts, while those in all other data bytes receive 0 volts. Bitlines $BL_{00}$ to $BL_{07}$ in byte 0 of the top row receive 1 volts, and because select transistors $14_0$ and $14_7$ are on, the drain terminals of cells $12_0$ to $12_7$ in byte 0 receive 1 volts. With the gate, drain, and source terminals of cells $12_0$ to $12_7$ biased to 3 volts, 1 volts, and 0 volts respectively, the states of these cells are read. To the extent that none of the cells except for those in byte 0 of the top row receive the read biasing voltages, they are not read.

Figure 3:
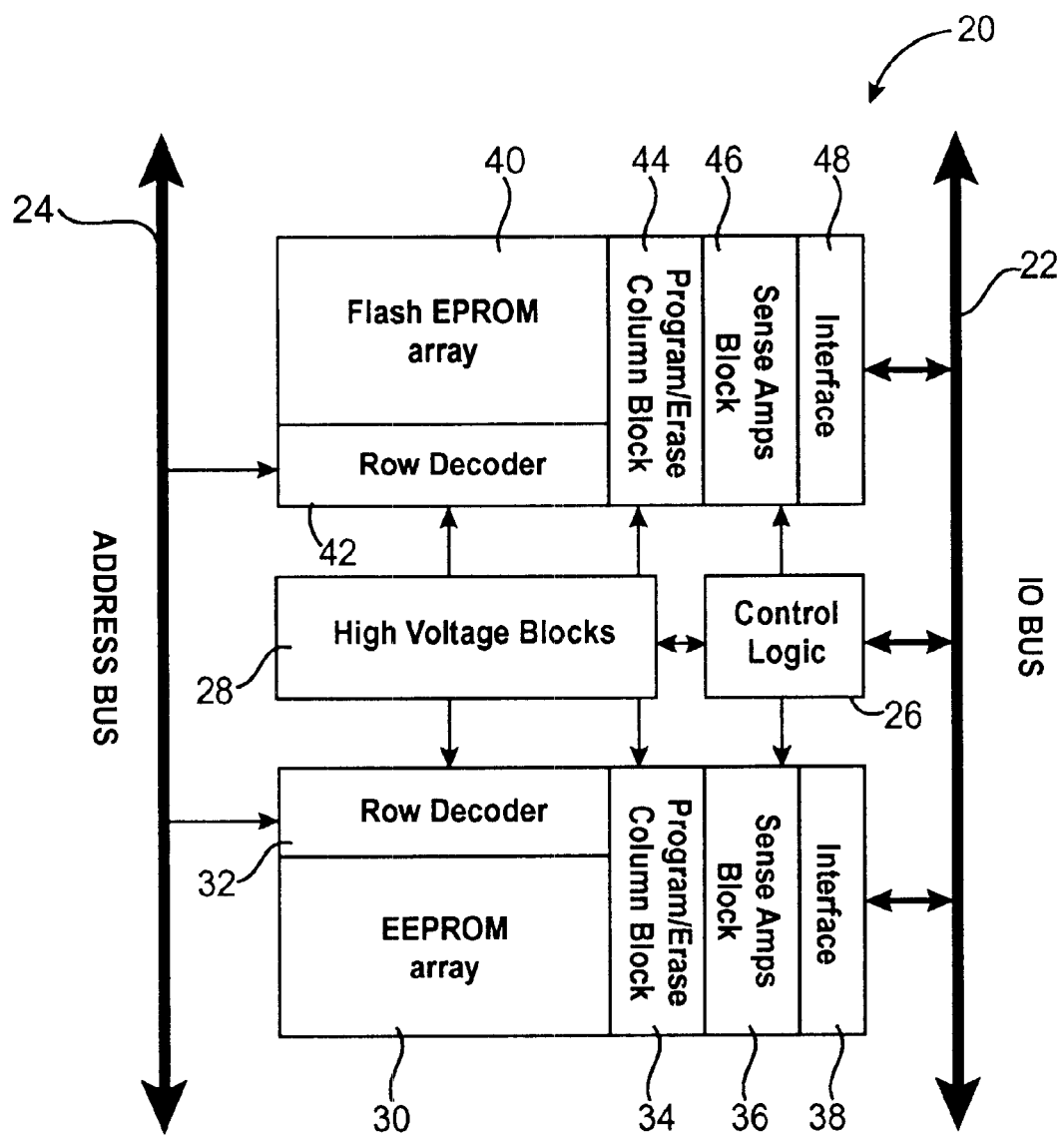
FIG. 3 shows some of the circuit blocks that are included in an integrated circuit memory containing both an EEPROM array and a flash EPROM array, in accordance with one embodiment of the present disclosure.

FIG. 3 shows a simplified block diagram of an integrated circuit memory device 20, which includes both an EEPROM array 30 and a flash EPROM array 40, in accordance with one embodiment of the present invention. Cell $12_i$ is advantageously used to form both the EEPROM array 30 (as shown in FIG. 1 and described above) and the flash EPROM array 40 (as described in the above-referenced U.S. application Ser. No. 09/503,982). Because both the EEPROM and flash EPROM arrays are formed using cells $12_i$, the voltages applied to both arrays during program, erase, and read are substantially the same.

In FIG. 3, externally provided address signals are transferred to row decoders 32 and 42 and column decoders (not shown) of the respective arrays 30 and 40 via an address bus 24. Row decoders 32 and 42 and column decoders not shown respectively decode the addressed location within arrays 30 and 40. A high voltage blocks 28 supplies high voltage signals to both arrays 30 and 40 as well as other logic circuits for programming and erase operations (and read operation if voltages greater than the externally provided supply voltage are needed during read). A control logic block 26 provides control signals to both arrays 30 and 40 during programming, read, and erase operations. A program/erase column block 44, sense amplifier block 46, and interface block 48 are provided for interface with array 40. Similarly, a program/erase column block 34, sense amplifier block 36, and interface block 38 are provided for interface with array 30. Data IO bus 22 is coupled to both interface blocks 38 and 48 to enable transfer of data to and from the two memory arrays.

Integrated circuit memory 20 can be designed to operate in a number of ways. For example, by providing each of the two memory arrays 30 and 40 its dedicated address and data bus, and duplicating some of the internal circuitry, the two memory arrays 30 and 40 can be accessed simultaneously. This allows the flash EPROM array to be accessed, for example, to carry out a read operation at the same time that the EEPROM array is accessed to carry out, for example, a programming operation. As can be seen, such flexible design enables the two memory arrays to be accessed simultaneously to carry out any combination of read, programming, and erase operations. Alternatively, memory IC 20 can be designed so that only one of the two memory arrays 30 and 40 can be accessed at any one time. This helps reduce the total die size by allowing circuit blocks to be shared between the two arrays. This design may be suited for applications where lower device cost is of greater importance while the functional flexibility is not as critical.

Thus, the memory cell and the corresponding flash EPROM array described in the above-referenced U.S. application Ser. No. 09/503,982, along with the EEPROM array architecture of FIG. 2 allow combining flash EPROM functionality along with EEPROM functionality on the same IC such that each of the flash EPROM and the EEPROM portions of the IC are capable of functioning in accordance with conventional standards (e.g., the EEPROM can be erased byte-by-byte, while the flash EPROM can be erased sector-by-sector).

The exemplary embodiments of the present disclosure are illustrative and not limiting. The invention is not limited by the number of rows and columns of memory cells $12_i$ forming the memory array. The invention is not limited by the type of select transistor or byte-select transistor that is disposed in array section 10. The invention is not limited to the number of bits that are included in each group of data columns. For example, each data group may include 16 or 32 cells to thereby form a memory which is 16-bits or 32-bits wide. Nor is the invention limited by the level of voltages that are applied to a memory array during each of the program/erase/read operations. Other variations of the invention are obvious in light of this disclosure and are intended to fall within the scope of the appended claims.

What is claimed is:

1. A non-volatile integrated circuit memory comprising:
   an EEPROM array comprising a first plurality of memory cells; and
   a flash EPROM array comprising a second plurality of memory cells, wherein a memory cell in each of the first and second plurality of memory cells includes a double-poly stacked-gate having a gate terminal, a source region having a terminal and a drain region having a terminal, wherein the memory cell is programmed by inducing hot electron injection and erased by inducing electron tunneling both through its drain side.

2. The integrated circuit memory of claim 1, wherein a drain terminal of each memory cell in the EEPROM array is coupled to a bitline disposed within the EEPROM array through an associated drain-select transistor.

3. The integrated circuit memory of claim 2 wherein the memory cells along a row in the EEPROM array are divided into a predesignated number of groups, the gate terminals of memory cells in each group being connected together and to first and second signal lines through an associated pair of first and second group-select transistors.

4. The integrated circuit memory of claim 3 wherein the first and second group-select transistors in the EEPROM array are PMOS transistors.

5. The integrated circuit memory of claim 3 wherein the source terminal of each memory cell disposed along a row of the EEPROM array is coupled to a third signal line.

6. The integrated circuit memory of claim 3 wherein the source terminal of each of the memory cells disposed along two adjacent rows of the EEPROM array is coupled to a third signal line.

7. The integrated circuit memory of claim 3 wherein gate terminals of each pair of first and second group-select transistors associated with each of the predesignated number of groups of memory cells along the row are configured to receive a different pair of select signals.

8. The integrated circuit memory of claim 3 wherein one of drain and source terminals of each of the second group-select transistors associated with each of the predesignated number of groups of memory cells along the row in the EEPROM array are connected together to form a first wordline extending parallel to the row, the wordline being one of the first and second signal lines, and a gate of each drain-select transistor associated with each cell along the row being connected together to form a second wordline extending parallel to the row.

9. The integrated circuit memory of claim 2 wherein the associated drain-select transistor of each memory cell in the EEPROM array is an NMOS transistor.

10. The integrated circuit memory of claim 1 further comprising a high voltage circuitry configured to supply high-voltage signals to each of the flash EPROM array and the EEPROM array.

11. The integrated circuit memory of claim 10 further comprising a control logic configured to control the operation of each of the flash EPROM array and the EEPROM array.

12. The integrated circuit memory of claim 11 wherein each of the flash EPROM array and the EEPROM array receives address and data signals from a plurality of shared address and date lines.

13. A method of operating a non-volatile integrated circuit memory, the method comprising the acts of:
    accessing a memory cell in one or both of an EEPROM array and a flash EPROM array disposed within the integrated circuit memory, wherein the memory cell includes a double-poly stacked-gate having a gate terminal, a source region having a terminal and a drain region having a terminal;
    programming the memory cell through its drain side by inducing hot electron injection; and
    erasing the memory cell through its drain side by inducing electron tunneling.

14. The method of claim 13 wherein the accessing act further comprises selectively coupling a drain terminal of each memory cell in the EEPROM array to a corresponding one of a plurality of bitlines disposed within the EEPROM array through an associated drain-select transistor.

15. The method of claim 13 wherein the memory cells along a row in the EEPROM array are divided into a predesignated number of groups, the memory cells in each group having their gate terminals connected together, the accessing act further comprising selectively coupling the gate terminals of the memory cells in each group along the row to a first and a second signal line through a pair of first and second group-select transistors associated with each group.

16. The method of claim 15 wherein the accessing act further comprises supplying a first voltage to a source terminal of each memory cell disposed along a row of the EEPROM array.

17. The method of claim 15 wherein the selectively coupling act further comprises applying a different one of a plurality of pairs of select signals to gate terminals of each pair of the first and second group-select transistors along the row of the EEPROM array for selecting one or more of the groups of memory cells.

18. The method of claim 13 further comprising controlling at least portions of circuitry coupled to each of the flash EPROM array and the EEPROM array with a control logic.

19. The method of claim 13 further comprising supplying address and data signals to each of the flash EPROM array and the EEPROM array using same set of address and date lines.

20. The method of claim 13 further comprising accessing the flash EPROM array and the EFPROM array to perform one of read, write, and erase operations in the flash EPROM array simultaneously with one of read, write and erase operations in the EEPROM array.

21. The method of claim 13 further comprising:
    programming a preselected number of memory cells in each of the flash EPROM and EEPROM arrays by applying same signals to the preselected memory cells in each of the flash EPROM and EEPROM arrays; and
    erasing a preselected number of memory cells in each of the flash EPROM and EEPROM arrays by applying same signals to the preselected memory cells in each of the flash EPROM and EEPROM arrays.

22. A non-volatile integrated circuit memory comprising:
    a flash EPROM array having a first plurality of memory cells;
    an EEPROM array having a second plurality of memory cells arranged along rows and columns, the memory cells along one of the rows being divided into a predesignated number of groups of cells, the memory cells in each group having their gate terminals connected together to form a gate-line, the EEPROM array further comprising:
        a plurality of group-select transistors arranged along the rows and columns, one of the drain and source terminals of each of the group-select transistors along said one of the rows being connected to a different one of the gate-lines of the groups of cells along said one of the rows, and the other one of the drain and source terminals of each of the group-select transistors along said one of the rows being connected together to form a global wordline extending parallel to the rows.

23. The integrated circuit memory of claim 22 wherein gate terminals of the group-select transistors along each of the columns are connected together to form a first plurality of select lines, wherein during a memory operation a first plurality of select signals are provided on the first plurality of select lines to select one of the predesignated number of groups of cells along a preselected row of cells in the EEPROM array.

24. The integrated circuit memory of claim 22 wherein each of the second plurality of memory cells is coupled to a corresponding bitline through an associated bitline select transistor, wherein gate terminals of the bitline select transistors along each row of cells are connected together to form a first plurality of wordlines extending parallel to the rows of cells in the EEPROM array.

25. The integrated circuit memory of claim 22 wherein source terminals of the memory cells along two adjacent rows of the EEPROM array are coupled together to form a source line extending parallel to the rows.

26. The integrated circuit memory of claim 22 wherein the first and second plurality of memory cells are substantially similar memory cells.

* * * * *